(12) United States Patent
Tsai et al.

(10) Patent No.: US 7,447,016 B2
(45) Date of Patent: Nov. 4, 2008

(54) DISK DRIVE CAGE WITH SHIELDING MEMBER

(75) Inventors: Lung-Sheng Tsai, Taipei Hsien (TW);
Yi-Lung Chou, Taipei Hsien (TW);
Li-Ping Chen, Taipei Hsien (TW);
Wen-Tzu Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 231 days.

(21) Appl. No.: 11/565,657

(22) Filed: Dec. 1, 2006

(65) Prior Publication Data
US 2008/0130216 A1  Jun. 5, 2008

(51) Int. Cl.
*G06F 1/16* (2006.01)
(52) U.S. Cl. ............... 361/685; 361/759; 347/102; 720/600
(58) Field of Classification Search .......... 720/165, 720/600, 665; 504/100, 104; 312/223.2–223.3; 475/351; 347/102, 104; 361/748, 759, 679–687, 361/724–727
See application file for complete search history.

(56) References Cited

U.S. PATENT DOCUMENTS

| 5,717,570 | A  | * | 2/1998  | Kikinis ............... 361/685 |
| 5,986,881 | A  |   | 11/1999 | Yang |
| 6,359,777 | B1 | * | 3/2002  | Newman et al. ....... 361/683 |
| 6,381,130 | B1 | * | 4/2002  | Yen .................. 361/685 |
| 6,392,884 | B1 | * | 5/2002  | Chou ................ 361/687 |
| 6,590,848 | B1 |   | 7/2003  | Chen |

* cited by examiner

*Primary Examiner*—Hung V Duong
(74) *Attorney, Agent, or Firm*—Wei Te Chung

(57) ABSTRACT

A disk drive cage includes a bracket (20) and a shielding member (10). The bracket includes two parallel side plates (21, 22). A positioning flange (212) is bent from one of the side plates (21). The shielding member includes a front wall (13), a top wall (15), a bottom wall (16), a first side wall (12), and a second side wall (14). A resilient lip piece (141) is formed on the second side wall and having at least one locking tab (142) engaging with the positioning flange when the shielding member inserts into the bracket. The top wall and the bottom wall has arc-shaped edges (152, 162) to allow resilient deformation of the first side wall towards the arc-shaped edges by the other one of the side plates (22), and the shielding member rotating out from the bracket.

17 Claims, 6 Drawing Sheets

DISK DRIVE CAGE WITH SHIELDING MEMBER

BACKGROUND

1. Technical Field

The present invention relates to disk drive cages, and more particularly to a disk drive cage with a shielding member for preventing EMI (Electro Magnetic Interference).

2. General Background

In a computer or a server, a drive cage is provided to receive disk drives. However, space in the drive cage is often not fully utilized. A void is thus formed that may allow EMI to radiate therefrom. So, a shielding member is needed to cover the void. In some computer, the shielding member is usually secured to the bracket with screws or directly formed on the bracket by stamping. It is inconvenient to remove and reassemble the shielding member when the void is used to receive additional disk drives.

What is needed, therefore, is a disk drive cage having a shielding member, which is conveniently assembled and removed.

SUMMARY

A disk drive cage includes a bracket and a shielding member. The bracket includes two parallel side plates. A positioning flange is bent from one of the side plates. The shielding member includes a front wall, a top wall, a bottom wall, a first side wall, and a second side wall. A resilient lip piece is formed on the second side wall and having at least one locking tab engaging with the positioning flange when the shielding member inserts into the bracket. The top wall and the bottom wall have arc-shaped edges to allow resilient deformation of the first side wall towards the arc-shaped edges by the other one of the side plates, and the shielding member rotating out from the bracket.

Other advantages and novel features will be drawn from the following detailed description of preferred embodiments with attached drawings, in which:

DETAILED DESCRIPTION OF PREFERRED EMBODIMENTS

Figure 1:
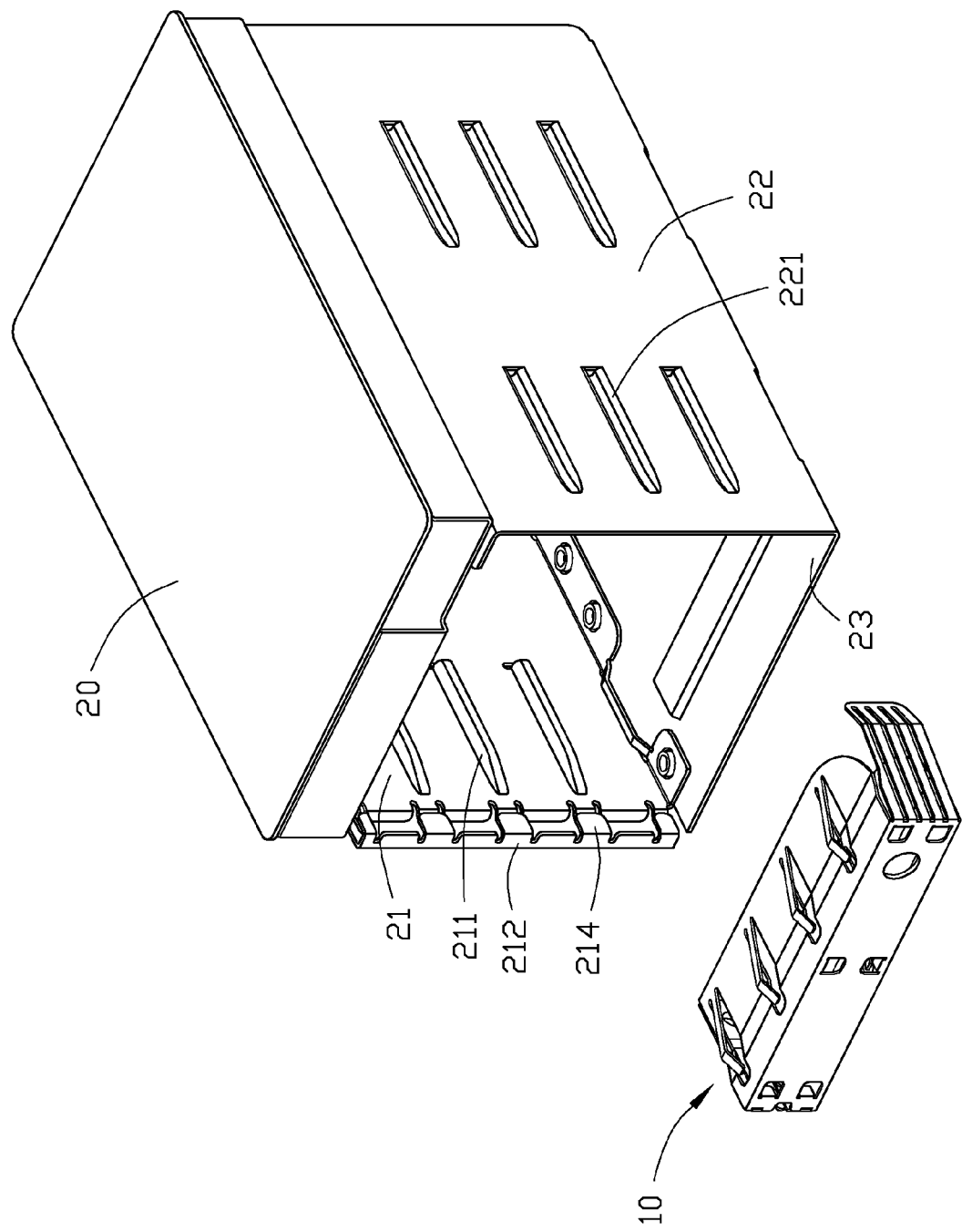
FIG. 1 is an exploded, isometric view of a disk drive cage of a preferred embodiment of the present invention, the disk drive cage including a bracket and a shielding member.

Referring to FIG. 1, a disk drive cage of a preferred embodiment of the present invention includes a bracket 20 for receiving a plurality of disk drives (not shown) therein, and a shielding member 10 for preventing EMI.

The bracket 20 is a generally rectangular shaped framework, and includes a bottom wall 23, and two parallel side plates 21, 22 respectively bent perpendicularly from two opposite side edges of the bottom wall 23. A plurality of parallel guiding pieces 211, 221 is bent in from the side plates 21, 22. A positioning flange 212 is perpendicularly bent in from a front edge of the side plate 21. A plurality of spaced bent pieces 214 is bent in from the positioning flange 212.

Figure 2:
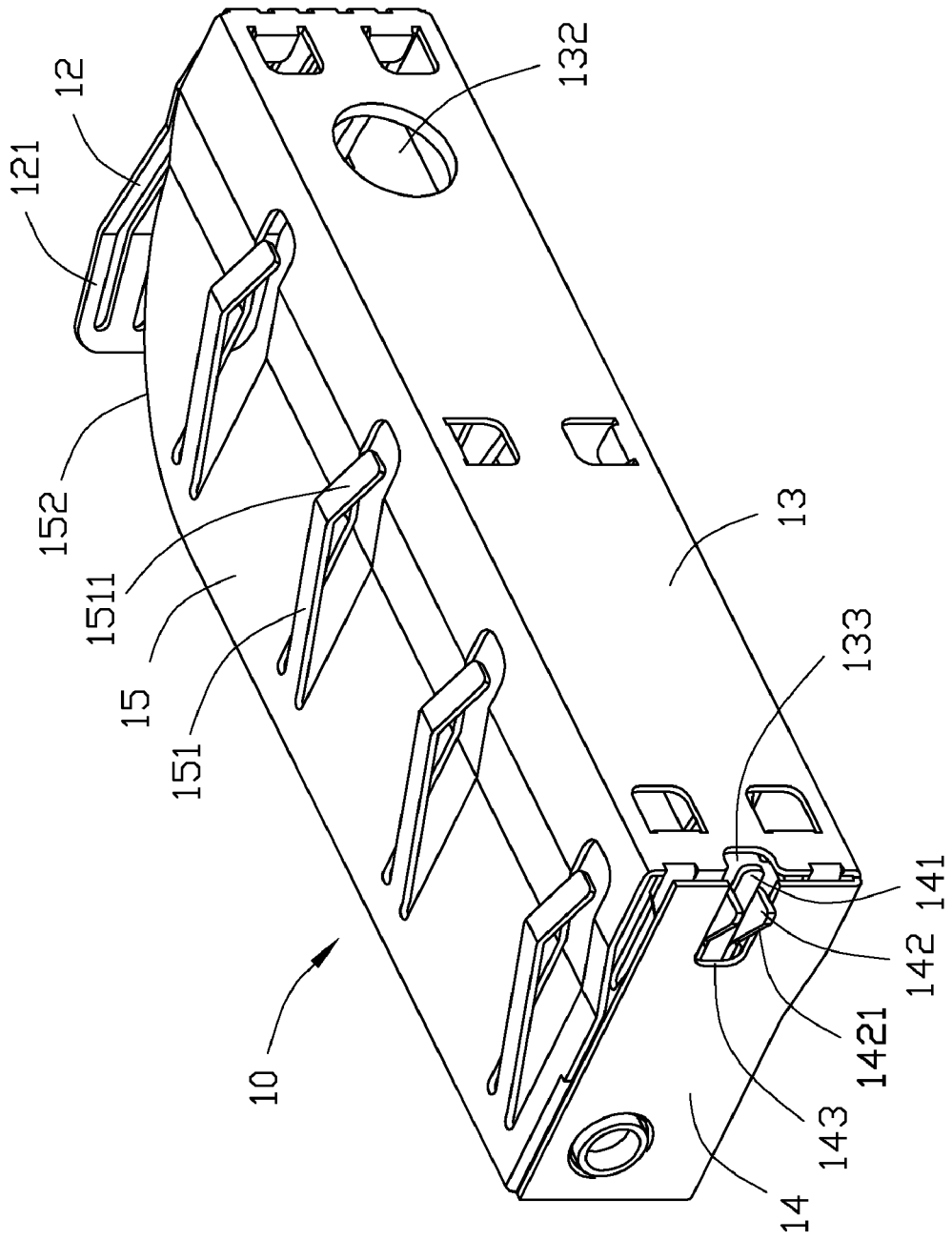
FIG. 2 is another isometric view of the shielding member of FIG. 1, but viewed from another aspect.
Figure 3:
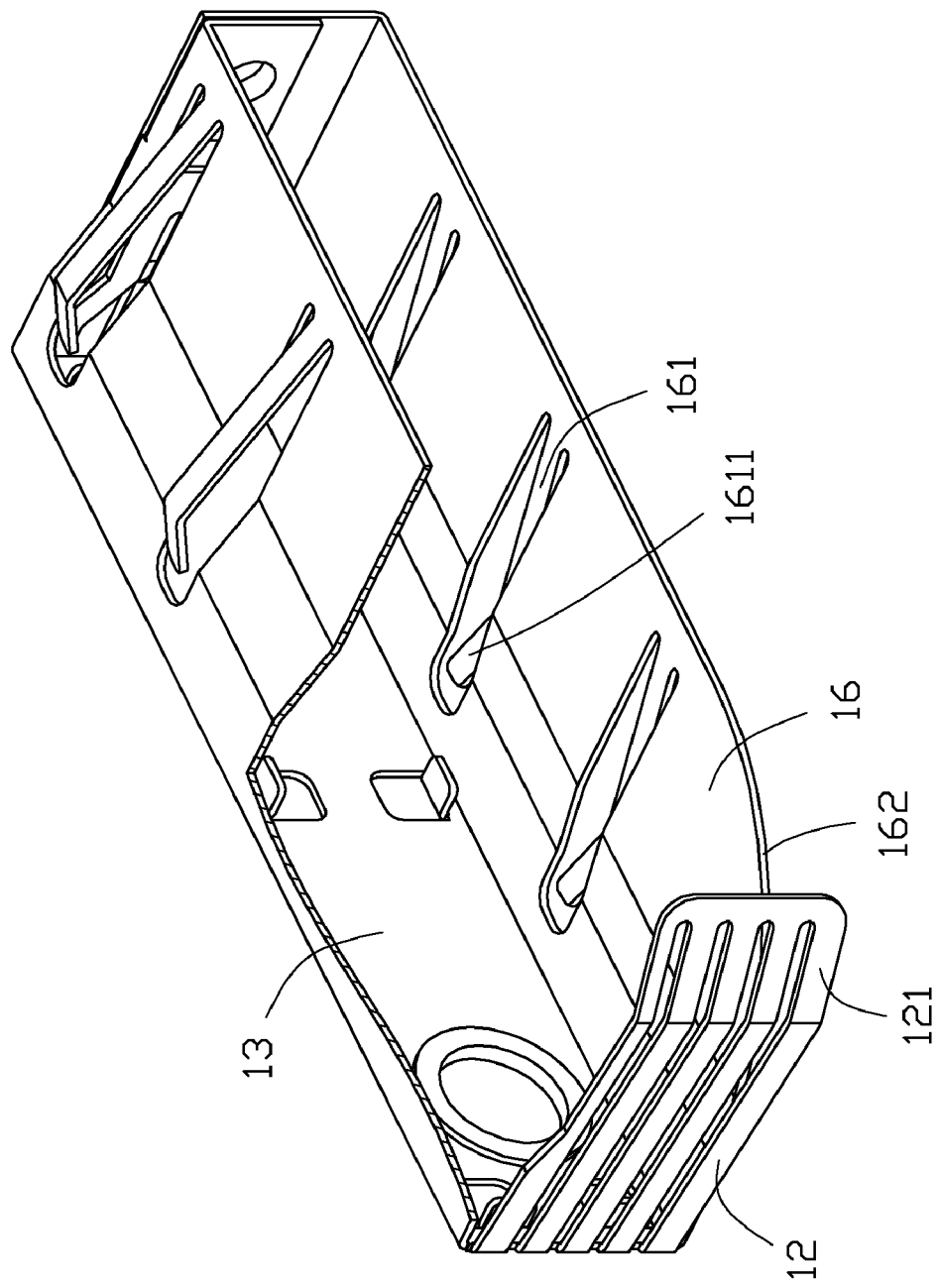
FIG. 3 is another isometric view of the shielding member of FIG. 2, but viewed from another aspect and showing the shielding member being cutaway.

Referring to FIGS. 2 and 3, the shielding member 10 includes a front wall 13, a top wall 15, a bottom wall 16, and first and second side walls 12, 14. A circular access hole 132 is defined in a right end portion of the front wall 13. An access cutout 133 is defined in a left end edge of the front wall 13. The top wall 15 and the bottom wall 16 are respectively bent from top and bottom edges of the front wall 13, and have a plurality of resilient fingers 151, 161 slantingly extending out of the shielding member 10. Free ends 1511, 1611 of the resilient fingers 151, 161 are bent in. Each of the top wall 15 and the bottom wall 16 has an arc-shaped edge 152, 162, adjacent the first side wall 12. The first side wall 12 is slantingly bent out from the left edge of the front wall 13. An end portion 121 of the first side wall 12 is slantingly bent in and towards the second side wall 14. The second side wall 14 is bent up from the bottom wall 16, and defines a cutout 143 in a front edge, adjacent the cutout 133 of the front wall 13. A lip piece 141 extends from an inner surface of the second side wall 14 in the cutout 143. A pair of locking tabs 142 is bent out from top and bottom edges of the lip piece 141, and extends out of the shielding member 10 from the cutout 143. Each of the locking tabs 142 has a bevel edge 1421.

Figure 4:
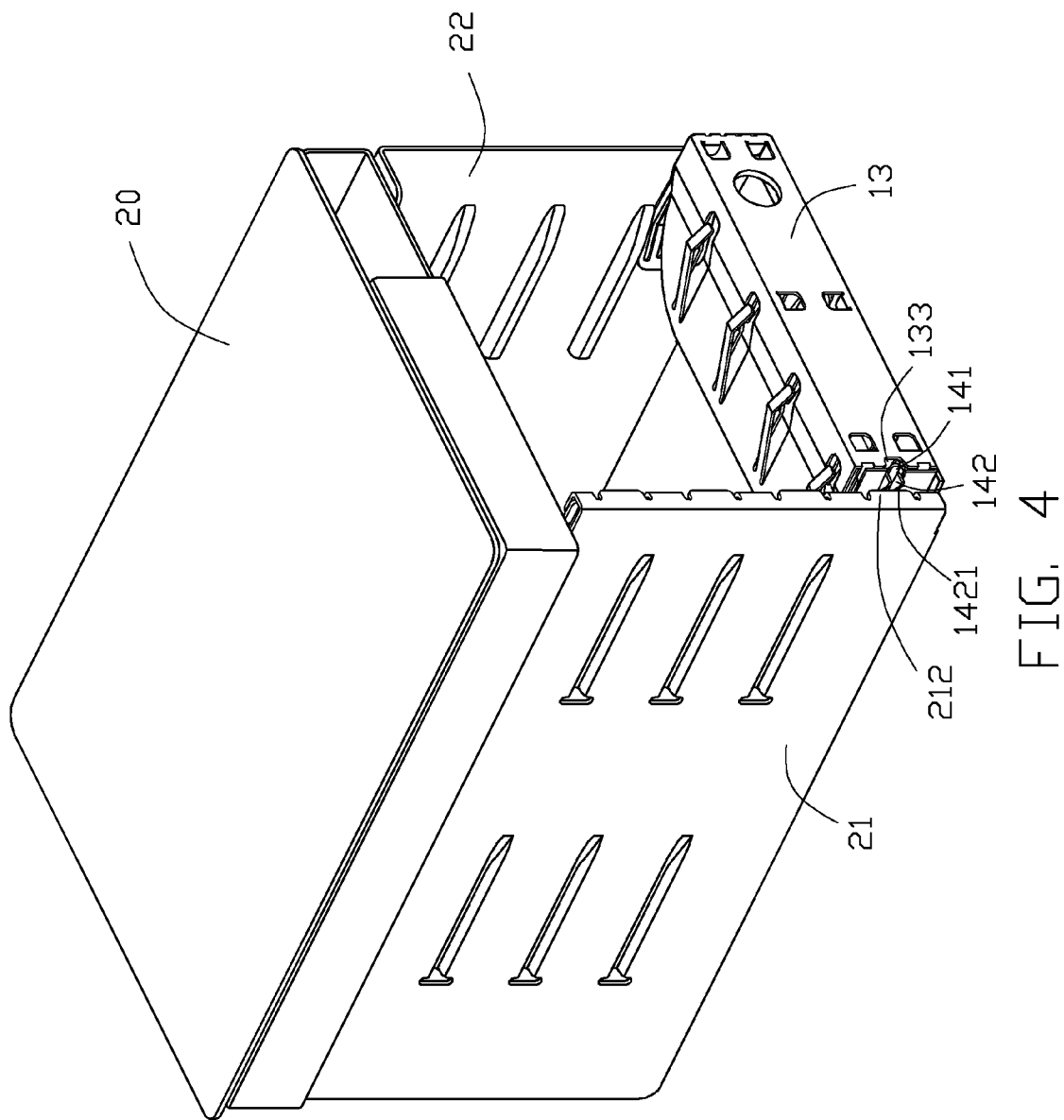
FIG. 4 is an assembled view of FIG. 1, showing the shielding member in an unlocked state.
Figure 5:
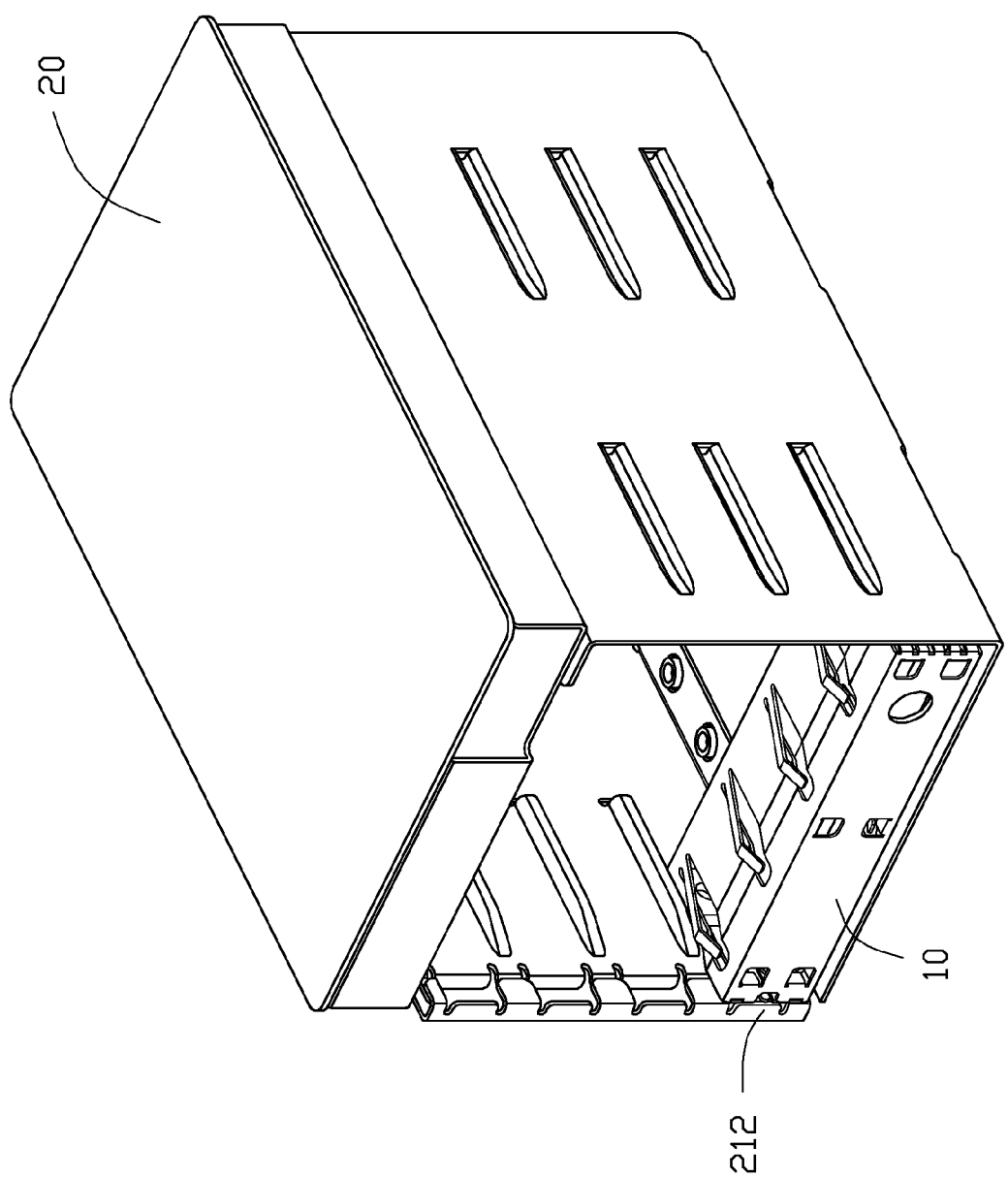
FIG. 5 is another isometric view of FIG. 4, but viewed from another aspect and showing the shielding member in a locked state.

Referring to FIG. 4, in assembly, the shielding member 10 is inserted into the bracket 20 until the bevel edges 1421 of the locking tabs 142 of the lip piece 141 abut the positioning flange 212 of the bracket 20. The shielding member 10 is sandwiched between the bent pieces 214 and the side plate 22 of the bracket 20. The first and second side walls 12, 14 of the shielding member 10 are positioned between the guiding pieces 211, 221 of the side plate 21, 22 of the bracket 20. The first side wall 12 is pressed to resiliently deform by the side plate 22. Referring to FIG. 5, the shielding member 10 is pushed to further insert into the bracket 20 until the front wall 13 generally coplanar with the front edges of the bracket 20. The bevel edges 1421 of the locking tabs 142 are pressed by the positioning flange 212 of the side plate 21 to deform the lip piece 141 in, so that the locking tabs 142 of the lip piece 141 can pass over the positioning flange 212. After the locking tabs 142 pass over the positioning flange 212, the lip piece 141 rebounds. The locking tabs 142 abut against an inner side of the positioning flange 212 between two bent pieces 214, so that the shielding member 10 is blocked from sliding out of the bracket 20. The shielding member 10 is thus secured into the bracket 20.

Figure 6:
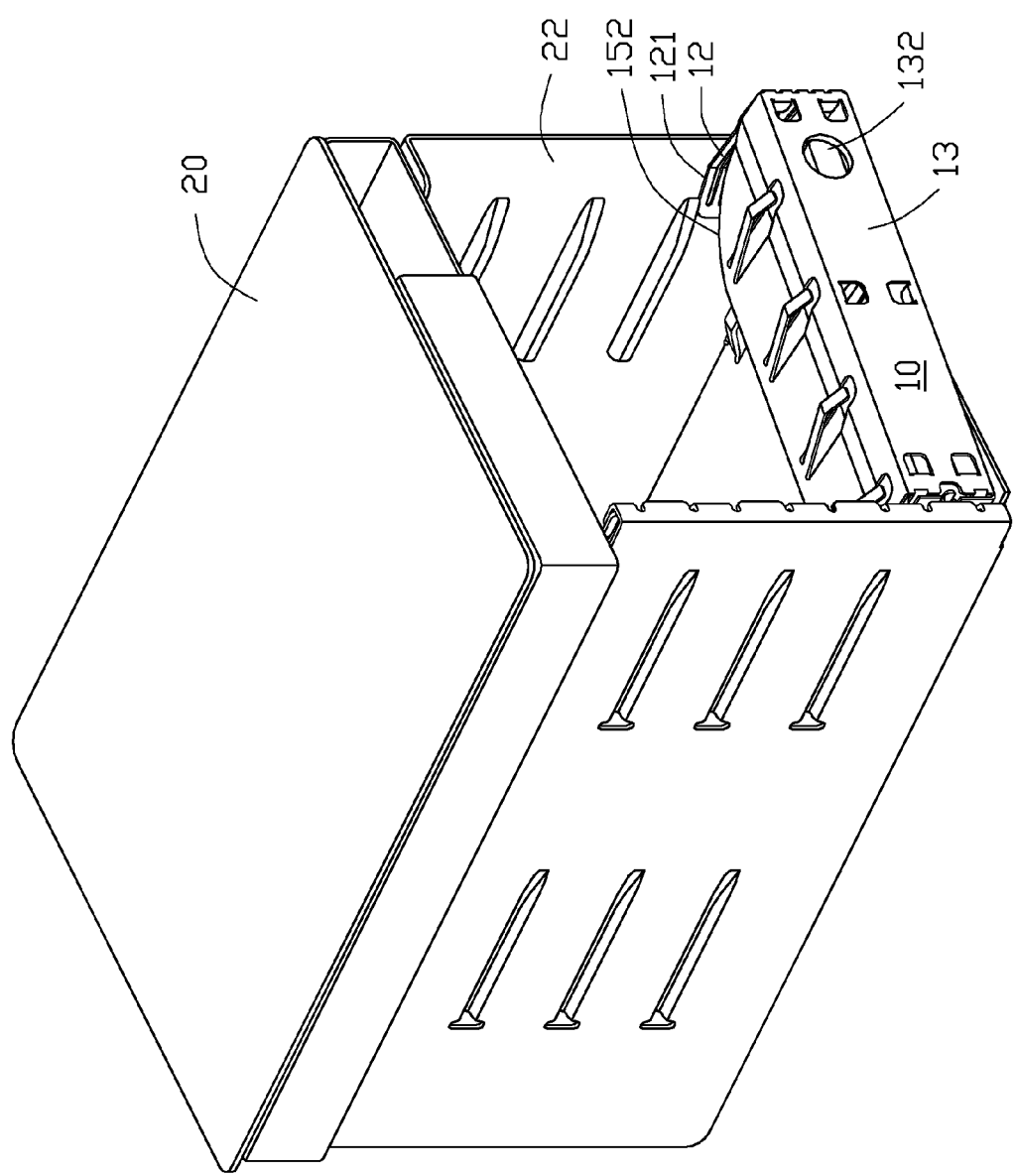
FIG. 6 is another isometric view of FIG. 5, but viewed from another aspect and showing the shielding in a removable position.

Referring to FIG. 6, because the top wall 15 and the bottom wall 16 have the arc-shaped edges 152, 162, the top wall 15 and the bottom wall 16 do not interfere with the bracket 20 when the shielding member 20 is rotated in or out the bracket 20. So, in disassembly, a left end of the shielding member 10 is pulled to rotate out through a tool or an user's finger pulling the shielding member 10 in the circular access hole 132 about an engaging line between the lip piece 141 and the positioning flange 212 of the side plate 21. The first side wall 12 is deformed toward the arc-shaped edges 152, 162 of the shielding member 10. After the first side wall 12 of the shielding member 10 is rotated out of the bracket 20, the shielding member 10 can be thus taken out of the bracket 20.

In this embodiment, a user reaching through the cutout 133 of the front wall 13 can resiliently deform the lip piece 141 by pressing with a tool or finger to disengage the locking tabs 142 from the positioning flange 212, so the shielding member 10 can be slid out of the bracket 20 by reaching through the circular access hole 132 with a tool or finger and pulling the front wall 13.

In this embodiment, the resilient fingers 151, 161 of the top wall 15 and the bottom wall 16 are used to electronically contact the bottom wall 23 of the bracket 20 and the disk drives (not shown) installed into the bracket 20, so that the shielding member 10 can better prevent EMI.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A disk drive cage comprising:
a bracket comprising two parallel side plates, a positioning flange bent from one of the side plates; and
a shielding member comprising a front wall, a top wall, a bottom wall, a first side wall, and a second side wall, a resilient lip piece formed on the second side wall and having at least one locking tab engaging with the positioning flange when the shielding member inserts into the bracket, the top wall and the bottom wall having arc-shaped edges to allow resilient deformation of the first side wall towards the arc-shaped edges by the other one of the side plates when the shielding member rotates out from the bracket.

2. The disk drive cage as described in claim 1, wherein the shielding member is rotatable about an engaging line between the at least one locking tab of the lip piece of the shielding member and the positioning flange of the bracket.

3. The disk drive cage as described in claim 1, wherein the front wall defines an access hole for extension of a tool or finger therethrough to pull the front wall to thereby draw the shielding member out from the bracket.

4. The disk drive cage as described in claim 1, wherein the first side wall is slantingly bent out from an edge of the front wall of the shielding member, and an end portion of the first side wall is slantingly bent in.

5. The disk drive cage as described in claim 1, wherein the second side wall defines a cutout therein, the at least one locking tab of the lip piece extending out of the shielding member through the cutout of the second side wall.

6. The disk drive cage as described in claim 1, wherein a plurality of bent pieces is perpendicularly bent in from the positioning flange of the one of the side plates for sandwiching the shielding member between the other one of the side plates and the bent pieces.

7. A disk drive cage comprising:
a bracket; and
a shielding member comprising a front wall with an access cutout defined therein, a resilient lip piece formed on the shielding member and having at least one locking tab, the at least one locking tab engaging with the bracket when the shielding member is slidably inserted into the bracket, and disengaging from the bracket by resiliently deforming the lip piece through the cutout of the front wall.

8. The disk drive cage as described in claim 7, wherein a positioning flange is formed on the bracket for engaging with the at least one locking tab of the lip piece of the shielding member.

9. The disk drive cage as described in claim 7, wherein the front wall of the shielding member defines an access hole therein, for extension of a tool or finger therethrough to pull the shielding member out of the bracket.

10. The disk drive cage as described in claim 7, wherein the shielding member defines a cutout therein, the at least one locking tab of the lip piece extending out of the shielding member through the cutout of the shielding member to thereby engage with the bracket.

11. The disk drive cage as described in claim 7, wherein the top wall and the bottom wall have a plurality of resilient fingers slantingly extending out therefrom.

12. A disk drive cage comprising:
a bracket comprising two parallel side plates configured to hold disk drivers therebetween and an opening for providing an access to the disk drivers to enter into the bracket, a positioning flange bent from one of the side plates; and
a shielding member comprising a front wall configured to cover one portion of the opening, a first side wall and a second side wall extending rearward from opposite sides of the front wall, a resilient piece formed on the second side wall and having at least one locking tab engaging with a rear side of the positioning flange when the shielding member is received within the bracket, the first side wall being deformable towards the second side wall by the other one of the side plates when the shielding member rotates out from the bracket about an engaging line between the at least one locking tab of the lip piece and the positioning flange.

13. The disk drive cage as described in claim 12, wherein the front wall of the shielding member defines adjacent to the second side wall a cutout configured for providing a space to the resilient piece to allow the resilient piece to be deformed in to thereby disegage the at least one locking tab from the positioning flange.

14. The disk drive cage as described in claim 12, wherein the at least one locking tab has a bevel edge for facilitating the at least one locking tab passing over the positioning flange.

15. The disk drive cage as described in claim 12, wherein the first side wall extends from the front wall away from the second side wall and then toward the second side wall.

16. The disk drive cage as described in claim 15, wherein the first side wall defines a plurality of slots extending in a direction parallel to an extension direction of the first side wall for improving deformablity of thereof.

17. The disk drive cage as described in claim 12, wherein the shielding member further comprises a top wall and a bottom wall extending from the front wall between the first and second side wall, the top wall and the bottom wall having arc-shaped edges to allow resilient deformation of the first side wall towards the arc-shaped edges.

* * * * *